(12) United States Patent
Kim

(10) Patent No.: US 9,529,217 B1
(45) Date of Patent: Dec. 27, 2016

(54) DISPLAY DEVICE

(71) Applicant: Samsung Display Co., Ltd., Yongin-si, Gyeonggi-do (KR)

(72) Inventor: Minsu Kim, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/045,509

(22) Filed: Feb. 17, 2016

(30) Foreign Application Priority Data

Jun. 9, 2015 (KR) .................. 10-2015-0081203

(51) Int. Cl.
*G02F 1/1333* (2006.01)
*H01L 27/12* (2006.01)
*G02F 1/1368* (2006.01)

(52) U.S. Cl.
CPC ....... *G02F 1/133305* (2013.01); *G02F 1/1368* (2013.01); *H01L 27/124* (2013.01); *H01L 27/1218* (2013.01); *H01L 27/1222* (2013.01)

(58) Field of Classification Search
CPC .............. G02F 1/133305; G02F 1/1368; H01L 27/1218; H01L 27/1222; H01L 27/124
See application file for complete search history.

(56) References Cited

U.S. PATENT DOCUMENTS

| | | | |
|---|---|---|---|
| 2010/0060601 A1* | 3/2010 | Oohira | G02F 1/133308 345/173 |
| 2014/0353625 A1 | 12/2014 | Yi et al. | |
| 2014/0354143 A1 | 12/2014 | Jung et al. | |
| 2015/0029684 A1 | 1/2015 | Park et al. | |
| 2015/0036300 A1 | 2/2015 | Park et al. | |

FOREIGN PATENT DOCUMENTS

| | | |
|---|---|---|
| KR | 1020140142090 A | 12/2014 |
| KR | 1020150012515 A | 2/2015 |
| KR | 1020150014713 A | 2/2015 |

* cited by examiner

*Primary Examiner* — Karen Kusumakar
(74) *Attorney, Agent, or Firm* — Cantor Colburn LLP

(57) ABSTRACT

A display device includes: first and second panels facing each other, each of which includes a display area and a non-display area; and a driving unit connected to the first panel. The first panel includes a first flexible layer on a first substrate and in the display and non-display areas; a thin film transistor on a portion of the first flexible layer in the display area, the thin film transistor including gate, source an drain electrodes and a semiconductor layer; a wiring unit on a portion of the first flexible layer in the non-display area; and a second flexible layer on the wiring unit in the non-display area, the second flexible layer in the non-display area being elongated to define a portion thereof extended further than a terminal edge of the first substrate. The wiring unit connects the driving circuit unit to the first panel.

18 Claims, 8 Drawing Sheets

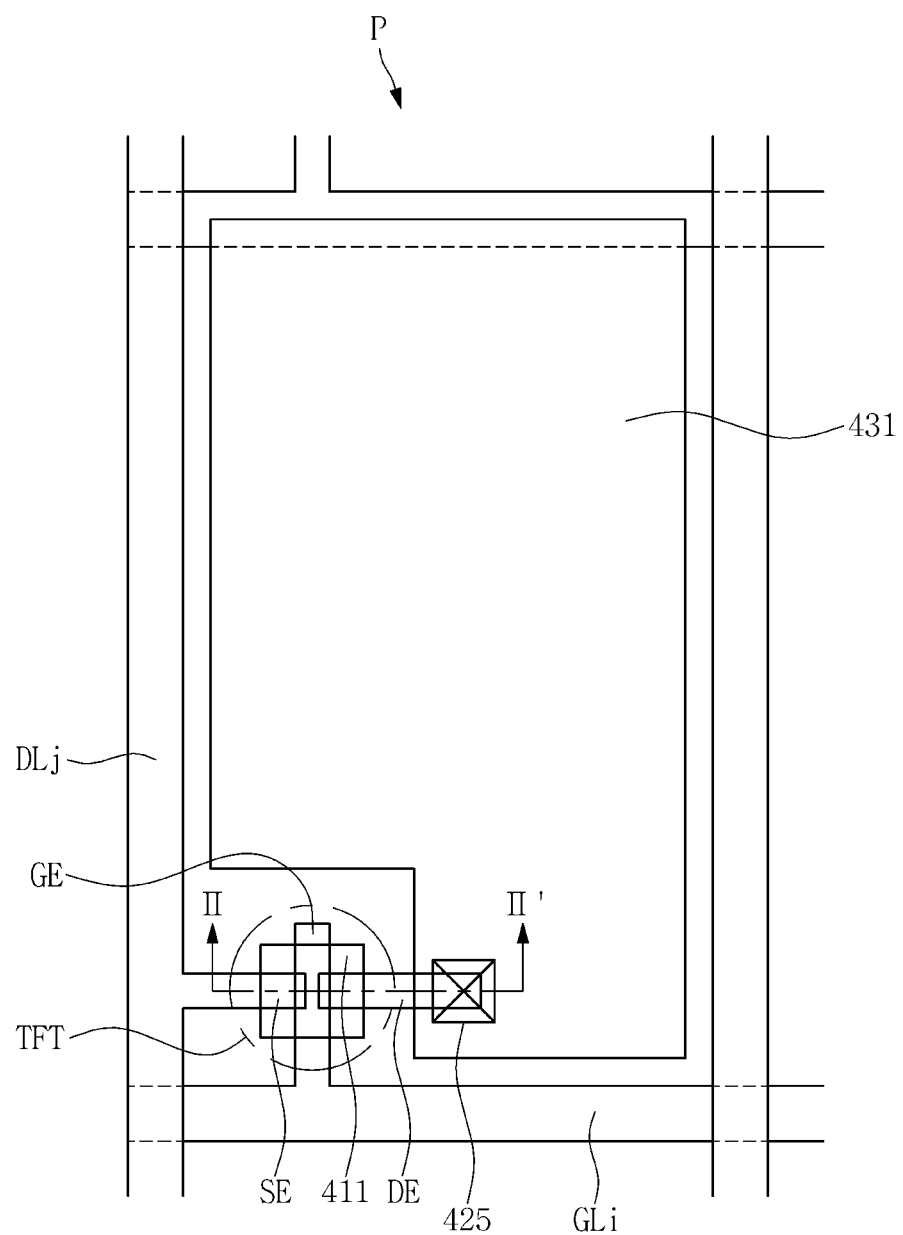

DISPLAY DEVICE

This application claims priority to Korean Patent Application No. 10-2015-0081203, filed on Jun. 9, 2015, and all the benefits accruing therefrom under 35 U.S.C. §119, the contents of which in their entirety are herein incorporated by reference.

BACKGROUND

1. Field

Exemplary embodiments of the invention relate to a display device, and more particularly, to a display device having a narrow bezel.

2. Description of the Related Art

In the information-dependent modern society, the significance of display devices as a visual information transfer medium is being widely acknowledged. Accordingly, requirements for display devices including, such as low-power consumption, slimness, lightweight and high-definition are desired and play an important role in the further development of information technology.

Such display devices are classified into: self-emission-type display devices in which a display panel thereof generates and emits light, such as by including, for example, cathode ray tubes ("CRT"), electroluminescent ("EL") display devices, light emitting diode ("LED") display devices, vacuum fluorescent display ("VFD") devices, field emission display ("FED") devices and plasma display panel ("PDP") devices; and non-emission-type display devices in which a display panel does not generate and emit light, such as, for example, liquid crystal display ("LCD") devices.

In line with trends of reducing an overall thickness and weight of such display devices, reducing a bezel width of a display device is also desired. With a reduced bezel width, display devices have advantages in terms of an aesthetically pleasing design and reducing an interval between adjacent display panels in a relatively large-sized display device using a number of display panels.

However, there is difficulty in providing a display device having a narrow bezel, due to a wiring, a driving circuit and/or a sealant that are in a non-display area of the display device surrounding a display area.

SUMMARY

One or more exemplary embodiments of the invention are directed to a display device having a narrow bezel and a method of manufacturing the display device.

According to an exemplary embodiment of the invention, a display device includes: a first panel and a second panel facing each other, each of which includes a display area in which an image is displayed and a non-display area in which an image is not displayed. The first panel includes a first flexible layer on a first substrate and in the display area and in the non-display area; a thin film transistor on a portion of the first flexible layer in the display area, the thin film transistor including a gate electrode, a semiconductor layer, a source electrode, and a drain electrode; a wiring unit on a portion of the first flexible layer in the non-display area, the wiring unit including a signal wiring through which a signal is provided to the display area; a second flexible layer on the wiring unit in the non-display area, the second flexible layer in the non-display area being elongated to define a portion thereof extended further than a terminal edge of the first substrate. The wiring unit with the second flexible layer thereon connects the driving circuit unit to the first panel.

The wiring unit in the non-display area may be elongated to define a portion thereof extended further than the terminal edge of the first substrate from which the second flexible layer is elongated.

The extended portions of each of the wiring unit and the second flexible layer may be bent along a side portion of the terminal edge of the first substrate.

The first flexible layer may have a thickness less than that of the second flexible layer.

Among layers of the first panel on the first substrate, the wiring unit may be in a same layer as that of the gate electrode of the thin film transistor.

The wiring unit may be connected to the thin film transistor.

The first flexible layer and the second flexible layer may include one of polyimide, polyethylene terephthalate, polycarbonate, polyethylene naphthalate, and polyacrylate.

The first flexible layer may have thermal resistance at a temperature of about 300 Celsius (° C.) or higher.

The display device may further include a passivation member between the side portion of the terminal edge of the first substrate and the extended portion of the wiring unit bent along the side portion of the terminal edge of the first substrate.

The first flexible layer in the display area may be elongated to define a portion thereof extended further than the terminal edge of the first substrate from which each of the second flexible layer and the wiring is elongated.

The second flexible layer may extend further from the terminal edge of the first substrate than the first flexible layer.

The first panel may further include a buffer layer between the first flexible layer and the thin film transistor in the display area and between the first flexible layer the wiring unit in the non-display area.

The driving circuit unit may include a flexible printed circuit board ("FPCB").

The first panel may further include an insulating interlayer on the thin film transistor in the display area.

The first panel may further include a pixel electrode on the insulating interlayer in the display area, the pixel electrode being connected to the thin film transistor.

The second panel may include a common electrode on a second substrate.

The display device may further include a sealing portion between the first panel and the second panel.

The first panel may further include a color filter on the thin film transistor in the display area.

BRIEF DESCRIPTION OF THE DRAWINGS

The above and other features of the invention will be more clearly understood from the following detailed description taken in conjunction with the accompanying drawings, in which:

FIG. 4 is an enlarged top plan view illustrating portion "P" of FIG. 1;

DETAILED DESCRIPTION

Figure 1:
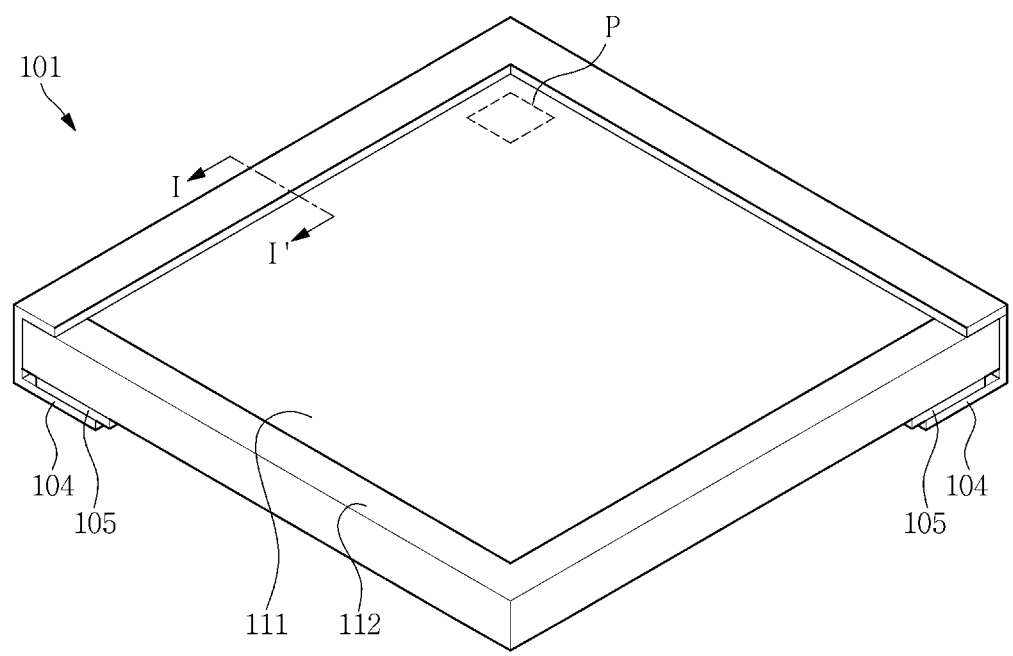
FIG. 1 is a perspective top plan view illustrating an exemplary embodiment of portions of a display device according to the invention.

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper," and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly physically connected" to the other element or "electrically connected" to the other element with none, one or more intervening elements interposed therebetween. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, an exemplary embodiment with respect to a display device will be described with reference to FIGS. 1, 2, 3, 4, and 5.

FIG. 1 is a perspective top plan view illustrating an exemplary embodiment of portions of a display device according to the exemplary embodiment.

Figure 2:
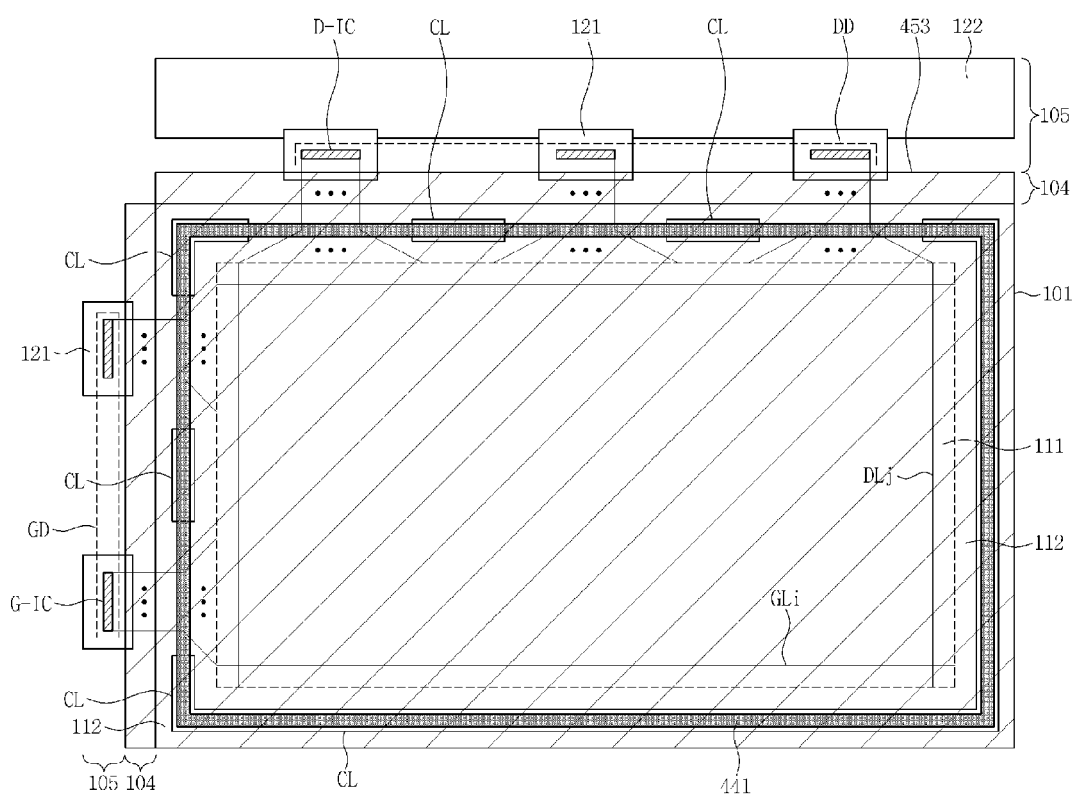
FIG. 2 is a top plan view illustrating the display device of FIG. 1 for which a pad portion thereof is disposed in an un-bent state thereof.

FIG. 2 is a top plan view illustrating the display device of FIG. 1 for which a pad portion thereof is in an un-bent state thereof.

Figure 3A:
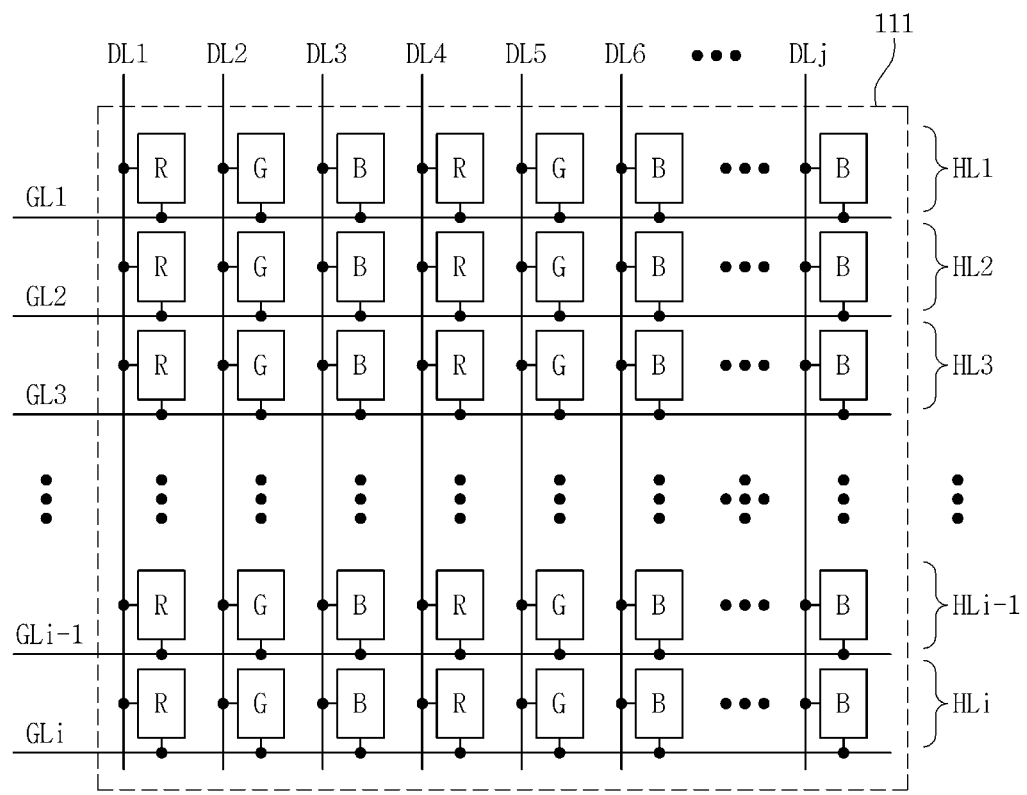
FIGS. 3A and 3B is a schematic top plan view illustrating pixels included in a display panel of a display device and an enlarged portion of FIG. 3A, respectively, according to the invention.
Figure 3B:
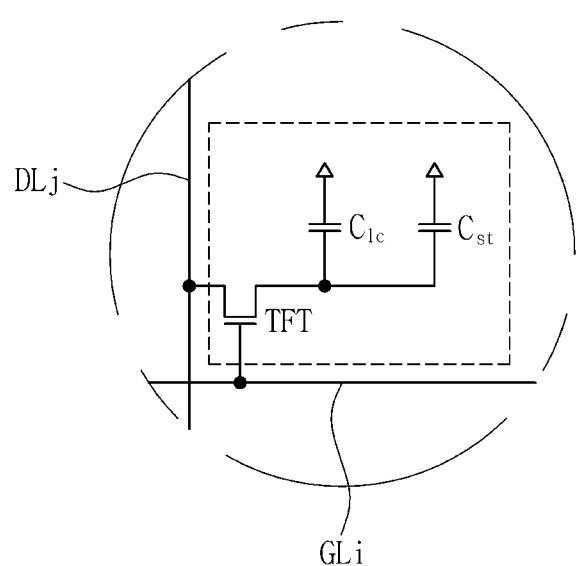

FIGS. 3A and 3B is a schematic top plan view illustrating pixels included in a display panel of the display device and an enlarged portion of FIG. 3A, respectively, according to the invention.

FIG. 4 is an enlarged top plan view illustrating portion "P" of FIG. 1.

Figure 5:
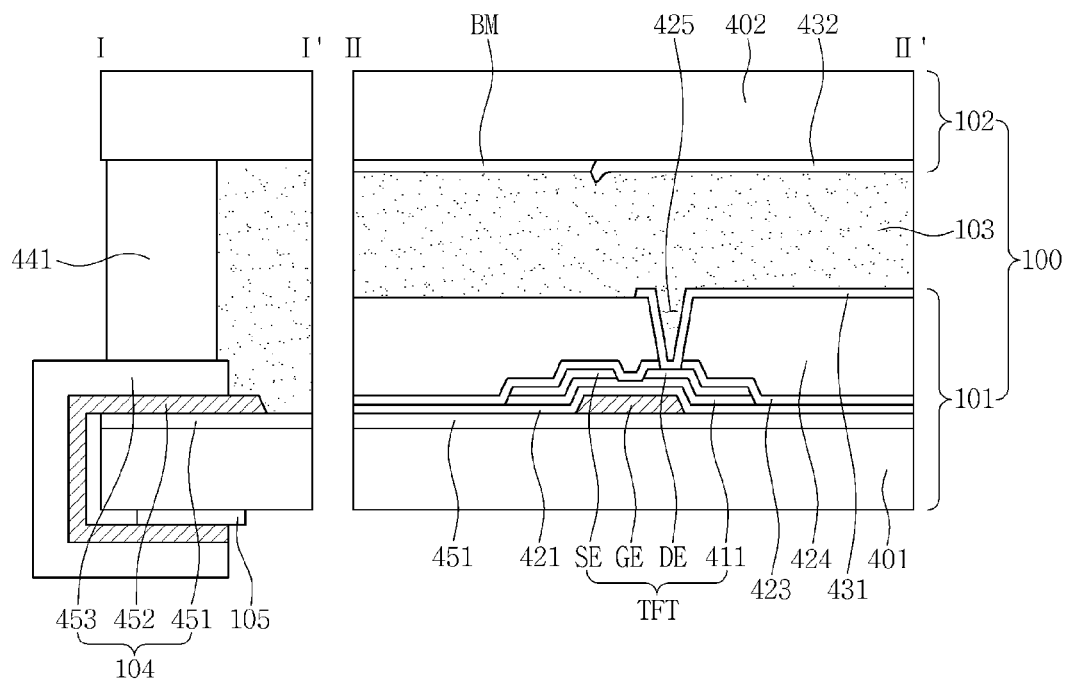
FIG. 5 is a cross-sectional view of the display device taken along line I-I' of FIG. 1 and taken along line II-II' of FIG. 4 according to the invention.

FIG. 5 is a cross-sectional view of the display device including taken along line I-I' of FIG. 1 and taken along line II-IF of FIG. 4 according to the invention.

Referring to FIGS. 1, 2, 3A, 3B, 4 and 5, a display device according to the exemplary embodiment includes a display panel 100, a pad portion 104 and a driving circuit (member) unit 105.

The display panel 100 is configured to display an image. The display panel 100 may be a liquid crystal display ("LCD") panel or an organic light emitting diode ("OLED") display panel. The display panel 100 according to the exemplary embodiment described hereinafter is an LCD panel.

The display panel 100 includes a liquid crystal layer 103, and a lower panel 101 and an upper panel 102 that face one another while having the liquid crystal layer 103 therebetween.

The display panel 100 is divided into a display area 111 and a non-display area 112. The display area 111 of the display panel 100 corresponds to a display area 111 of the lower panel 101 and a display area 111 of the upper panel 102. The non-display area 112 of the display panel 100 corresponds to a non-display area 112 of the lower panel 101 and a non-display area 112 of the upper panel 102.

The driving circuit unit 105, as illustrated in FIG. 2, may include a gate driver GD provided in plural, a gate driving integrated circuit G-IC provided in plural, a data driver DD provided in plural, a data driving integrated circuit D-IC provided in plural and a carrier 121 provided in plural.

The gate drivers GD generate gate signals based on a gate control signal supplied from a timing controller (not illustrated), and sequentially supplies the gate signals to a plurality of gate lines GL1 to GLi, respectively. The gate signals from the gate drivers GD may be provided through signal wirings of wiring unit 452 in the non-display area 112 of the lower panel 101 and finally to the gate lines GL1-GLi. The gate driver GD, for example, may include a shift register (not illustrated) that generates gate signals by shifting a gate start pulse based on a gate shift clock. The shift register may include a plurality of switching elements.

The data driving integrated circuits D-IC receive digital image data signals and a data control signal from the timing controller. The data driving integrated circuits D-IC perform sampling of the digital image data signals based on the data control signal, perform latching of the sampled digital image data signals corresponding to a single horizontal line for each horizontal period, and supply the latched digital image data signals to a plurality of data lines DL1 to DLj, respectively. In other words, the data driving integrated circuits D-IC convert the digital image data signals supplied from the timing controller into analog image data signals using gamma reference voltages that are input from a power supply, and supply the analog image data signals to the data lines DL1 to DLj, respectively. The data signals from the driving integrated circuits D-IC may be provided through the signal wirings of wiring unit 452 in the non-display area 112 of the lower panel 101 and finally to the data lines DL1 to DLj.

The data driving integrated circuits D-IC are mounted on the carriers 121, respectively.

The carrier 121 may be manufactured to have a tape or film shape.

The carriers 121 are electrically connected between a circuit board 122 and thin film transistors TFT. To this end, each of the carriers 121 includes a pad electrode provided in plural (not illustrated). The pad electrode is divided into a plurality of input terminals and a plurality of output terminals. In this instance, the input terminals of the carrier 121 are connected to signal wirings of the circuit board 122, respectively, and the output terminals of the carriers 121 are connected to signal wirings of wiring unit 452, respectively, a portion of the wiring unit 452 being provided in the non-display area 112 of a lower panel 101.

A first end of the carrier 121 at which the input terminals are disposed may be bonded to the circuit board 122 through an anisotropic conductive bonding film ("ACF") or an outer lead bonding ("OLB") manner. In addition, a second end of the carrier 121 opposite to the first end thereof and at which the output terminals are disposed may be bonded to the lower panel 101 through an ACF or an OLB manner.

The carriers 121 may include or be formed of a flexible, bendable material. In an exemplary embodiment, for example, the carrier 121 may be formed of polyimide having excellent coefficient of thermal expansion ("CTE") or durability. In addition, the carrier 121 may include or be formed of a synthetic resin such as, for example, acrylic, polyether nitrile, polyethersulfone, polyethylene terephthalate or polyethylenenaphthalate.

At least one of the signal wirings of the circuit board 122 transmits the image data signals and the data control signal supplied from the timing controller, to the data driving integrated circuit D-IC mounted on the carrier 121. In this instance, the data driving integrated circuit D-IC receives the image data signals and the data control signal through input signal wirings provided in the carrier 121. The data driving integrated circuit D-IC outputs analog image data signals through output signal wirings provided in the carrier 121. In this instance, each end of the input signal wirings corresponds to the aforementioned input terminal, and each end of the output signal wirings corresponds to the aforementioned output terminal.

At least another of the signal wirings of the circuit board 122 may transmit a gate control signal to the gate driver GD, through the signal wirings provided in one of the carriers 122 and through the signal wirings provided in the non-display area 112 of the lower panel 101.

The display panel 100, as illustrated in FIG. 3A, includes a plurality of pixels R, G and B. The pixels R, G and B are positioned in the display area 111 of the display panel 100. A pixel may include a pixel region at which an image is displayed and a non-pixel region at which an image is not displayed.

The pixels R, G and B are arranged in a matrix form. The pixels R, G, and B are categorized into red pixels R displaying a red image, green pixels G displaying a green image, and blue pixels B displaying a blue image. In this instance, horizontally adjacent red, green and blue pixels R, G and B may form a unit pixel for displaying a unit image. However, the invention is not limited thereto, and the pixel may include a white pixel displaying a while light or white image.

In FIG. 3A, there are j pixels (j being a natural number) arranged along an n-th horizontal line (n being one of 1 to i). The j pixels are also referred to as "n-th horizontal line pixels", and are individually connected to the first to j-th data lines DL1 to DLj, respectively. In addition, the n-th horizontal line pixels are connected to a common n-th gate line. Accordingly, the n-th horizontal line pixels receive a common n-th gate signal. In other words, all the j pixels arranged along the same horizontal line (e.g., pixel row) receive the same gate signals while other pixels disposed on different horizontal lines receive different gate signals from one another. In an exemplary embodiment, for example, a red pixel R and a green pixel G disposed on a first horizontal line HL1 all receive a first gate signal while a red pixel R and a green pixel G disposed on a second horizontal line HL2 all receive a second gate signal having a different timing from that of the first gate signal.

Each of the red, green and blue pixels R, G and B includes the thin film transistor TFT, a liquid crystal capacitor $C_{lc}$ and a storage capacitor $C_{st}$. Referring to the enlarged portion illustrated in FIG. 3B, the thin film transistor TFT is turned on based on a gate signal from the gate line GLi. The turned-on thin film transistor TFT supplies an analog image data signal supplied from the data line DLj to the liquid crystal capacitor $C_{lc}$ and the storage capacitor $C_{st}$. Since the thin film transistor TFT is turned on based on a gate signal from the gate line GLi, and since the gate signal of the gate line GLi is provided through the signal wirings of wiring unit 452 in the non-display area 112 of the lower panel 101, the wiring unit 452 is connected to the thin film transistor TFT.

As illustrated in FIG. 5, the liquid crystal capacitor $C_{lc}$ includes a pixel electrode 431 and a common electrode 432 disposed to oppose one another. The storage capacitor $C_{st}$ includes a pixel electrode 431 and an opposing electrode disposed to oppose one another. In this instance, the opposing electrode may be a previous gate line GLi-1 or a common line CL transmitting a common voltage.

As illustrated in FIGS. 3A, 3B, 4 and 5, the display area 111 of the display panel 100 includes a lower substrate 401 of the lower panel 101, an upper substrate 402 of the upper panel 102, a gate line GL provided in plural, a data line DL provided in plural, the common line CL provided in plural, the thin film transistor TFT provided in plural, a gate insulating layer 421, a passivation layer 423, a color filter 424, a drain contact hole 425, the pixel electrode 431 and a first flexible layer 451.

The lower substrate 401 may include or be formed of an insulating material and a transparent material such as glass or plastic.

The gate line GL may have a connection portion, for example, a distal end portion thereof, which is greater in size (e.g., planar dimension) than another portion thereof, to be connected to another layer of the display panel 100 or an external driving circuit (not illustrated). The gate line GL may define a gate electrode GE in plural protruding from a main portion of the gate line GL. The common line may be disposed in a same layer of the lower panel 101 as the gate line GL among layers disposed on the lower substrate 401. At least one of the gate line GL, the gate electrode GE and the common line CL may include or be formed of one of an aluminum (Al) based metal such as Al or an Al alloy, a silver (Ag) based metal such as Ag or an Ag alloy, a copper (Cu) based metal such as Cu or an Cu alloy, and a molybdenum (Mo) based metal such as Mo or a Mo alloy. In an alternative exemplary embodiment, at least one of the gate line GL, the gate electrode GE and the common line CL may include or be formed of one of chromium (Cr), tantalum (Ta), and titanium (Ti). At least one of the gate line GL, the gate electrode GE and the common line CL may have a multilayer structure including at least two conductive layers having different physical properties. In other words, in an exemplary embodiment of manufacturing a display panel, the gate line GL, the gate electrode GE and the common line may be simultaneously formed in the same process.

The data line DL is disposed on the gate insulating layer 421. The data line DL may have a connection portion, for example, a distal end portion thereof, which is greater in size (e.g., planar dimension) than another portion thereof, to be connected to another layer of the display panel 100 or an external driving circuit (not illustrated). The data line DL intersects the gate line GL in the top plan view. Although not illustrated, a parasitic capacitance between the data line DL and the gate line GL may decrease at an intersection between the data line DL and the gate line GL.

Referring to FIG. 4 and FIG. 5, the source electrode SE is disposed on a first portion of a semiconductor layer 411 of the thin film transistor TFT. The source electrode SE extends from the data line DLj. The data line DLj may define the source electrode SE in plural protruding from a main portion of the data line DLj. In an exemplary embodiment, for example, the source electrode SE has a shape protruding from a main portion of the data line DLj toward the gate electrode GE. The source electrode SE overlaps the semiconductor layer 411 and the gate electrode GE. The source electrode SE may include or be formed of, in particular, a refractory metal such as molybdenum (Mo), chromium (Cr), tantalum (Ta) and titanium (Ti) or an alloy thereof. The source electrode SE may have a multilayer structure including a refractory metal layer and a low-resistance conductive layer. Examples of the multilayer structure may include a triple-layer structure including a Cr or Mo (Mo alloy) lower layer, an Al (Al alloy) intermediate layer, and a Mo (Mo alloy) upper layer. Further, the source electrode SE may include or be formed of various metals or conductive materials, in addition to, or instead of, the aforementioned materials. The data line DL may be formed of the same material and may have the same structure (multilayer structure) as those of the aforementioned source electrode SE. In other words, in an exemplary embodiment of manufacturing a display panel, the data line DL and the source electrode SE may be simultaneously formed in the same process.

The drain electrode DE is disposed on a second portion of the semiconductor layer 411 of the thin film transistor TFT opposite to the first portion thereof. The drain electrode DE overlaps the gate electrode GE and the semiconductor layer 411. The drain electrode DE is connected to the pixel electrode 431 through the drain contact hole 425. The drain electrode DE may physically contact the pixel electrode 431 at the drain contact hole 425. The drain electrode DE may include or be formed of the same material and may have the same structure (multilayer structure) as those of the aforementioned source electrode SE. In other words, the drain electrode DE and the source electrode SE may be simultaneously formed in the same process. The drain electrode DE may be disposed in a same layer of the lower panel 101 as the data line DL and the source electrode SE among layers disposed on the lower substrate 401.

The semiconductor layer 411 is disposed on the gate insulating layer 421. In this instance, the semiconductor layer 411 overlaps the gate electrode GE. The semiconductor layer 411 may include or be formed of amorphous silicon, polycrystalline silicon, or the like.

The gate electrode GE, the source electrode SE, the drain electrode DE and the semiconductor layer 411 together constitute the thin film transistor TFT. In this instance, a channel of the thin film transistor TFT is formed in a portion of the semiconductor layer 411 exposed between the source electrode SE and the drain electrode DE. The portion of the semiconductor layer 411 corresponding to the channel has a cross-sectional thickness less than that of another portion of the semiconductor layer 411 adjacent thereto.

The gate insulating layer 421 is disposed on the gate line GL, the gate electrode GE and the common line CL. In this instance, the gate insulating layer 421 may be disposed over an entire surface of the lower substrate 401 which includes the gate line GL, the gate electrode GE and the common line CL thereon. The gate insulating layer 421 has a common contact hole (not illustrated) through which the common line is exposed. The gate insulating layer 421 may include or may be formed of silicon nitride ($SiN_x$), silicon oxide ($SiO_x$), or the like. The gate insulating layer 421 may have a multilayer structure including at least two insulating layers having different physical properties from each other.

The passivation layer 423 is disposed on the data line DL, the source electrode SE, the drain electrode DE and the gate insulating layer 421. In this instance, the passivation layer 423 may be disposed over an entire surface of the lower substrate 401 which includes the data line DL, the source electrode SE, the drain electrode DE and the gate insulating layer 421 thereon. The passivation layer 423 defines the drain contact hole 425 through which the drain electrode DE is exposed and the common contact hole through which the common line is exposed. The passivation layer 423 may include or may be formed of an inorganic insulating material such as $SiN_x$ or $SiO_x$. The inorganic insulating material may have photosensitivity and/or a dielectric constant of about 4.0. The passivation layer 423 may also have a double-layer structure including a lower inorganic layer and an upper organic layer. The double-layer structure of the passivation layer 423 may have an excellent insulating property, and may significantly reduce damage to an exposed portion of the semiconductor layer 411. The passivation layer 423 may have a cross-sectional thickness of greater than or equal to about 5000 angstroms (Å), and more particularly, in a range of about 6000 Å to about 8000 Å.

As illustrated in FIG. 5, the color filter 424 may be disposed on the passivation layer 423. An edge of the color filter 424 is disposed on the gate line GL, the thin film transistor TFT and the data line DL. As the color filter 424 includes an aperture, the aperture of the color filter 424 is formed corresponding to the drain contact hole 425. An edge of the color filter 424 may overlap an edge of an adjacent one of the color filters 424. The color filter 424 may include or be formed of a photosensitive organic material.

The pixel electrode 431, as illustrated in FIG. 5, may be disposed on the color filter 424. The pixel electrode 431 is physically and/or electrically connected to the drain electrode DE at the drain contact hole 425.

The pixel electrode 431 may include be formed of a transparent conductive material such as indium-tin oxide ("ITO") or indium-zinc oxide ("IZO"). In this instance, ITO may be a polycrystalline or monocrystalline material, and IZO may be a polycrystalline or monocrystalline material.

The upper panel 102 includes a light shielding portion BM and the common electrode 432.

The light shielding portion BM may be disposed on the upper substrate 402. The light shielding portion BM reduces or effectively prevents light leakage in an area other than a pixel region. Although not illustrated, the light shielding portion BM may alternatively or additionally be disposed in the lower panel 101 which includes the pixel electrode 431.

The common electrode 432 may be disposed on the upper substrate 402. The common electrode 432 may include or be formed of a transparent conductive material such as indium-tin oxide ("ITO") or indium-zinc oxide ("IZO"). The common electrode 432 of the upper panel 102 applies an electric field to the liquid crystal layer 103, along with the pixel electrodes 431 of the lower panel 101.

As illustrated in FIG. 5, a sealing portion 441 is included in the non-display area 112 of the lower panel 101 and the upper panel 102, and the sealing portion 441 overlaps a portion of the pad portion 104. Referring to FIGS. 1 and 2, the non-display areas 112 may exclude the display areas 111, and the non-display areas 112 may correspond to regions inside and outside the sealing portion 441.

The sealing portion 441 is positioned between the upper panel 102 and the lower panel 101. In detail, the sealing portion 441 may have, for example, a closed curved line shape that surrounds the display area 111 in the top plan view.

The pad portion 104 includes the first flexible layer 451, a portion of the wiring unit 452 and a second flexible layer 453. The portion of the wiring unit 452 disposed in the non-display area 112 of the lower panel 101 is extended further than an edge of the lower substrate 401 of the lower panel 101. A portion of the pad portion 104 overlaps the lower panel 101, the pad portion 104 is connected to an edge of the lower panel 101 and extends outwardly from an edge of the lower substrate 401 to be disposed non-overlapping with the lower substrate 401, and the pad portion 104 is connected to the driving circuit unit 105 which is disposed outside and separate from the lower substrate 401.

The first flexible layer 451 has a thickness less than that of the second flexible layer 453. The thicknesses may be taken in a cross-sectional direction of the un-bent state of the display device. For the bent state of the display device, the thicknesses may be taken in a direction normal to a surface on which the flexible layer is disposed.

The first flexible layer 451 is disposed over an entire surface of the lower substrate 401. The first flexible layer 451 disposed in the display area 111 extends to be disposed in the non-display area 112. Although not illustrated, the extended first flexible layer 451 in the non-display area 111 may be further extended outwardly of the lower substrate 401 (e.g., non-overlapping the lower substrate 401) as a portion of the pad portion 104 at the driving circuit unit 105, for example. In other words, the first flexible layer 451 may be simultaneously included in the lower panel 101 and the pad portion 104 as an element separate from the lower panel 101. The first flexible layer 451 may include or be formed of a flexible, bendable material. In an exemplary embodiment, for example, the first flexible layer 451 may include or be formed of one of polyimide, polyethylene terephthalate, polycarbonate, polyethylene naphthalate and polyacrylate.

The first flexible layer 451 has thermal resistance at a temperature of about 300 Celsius (° C.) or higher. Thus, the first flexible layer 451 may not be damaged during a high-temperature process used in a method of forming a display device.

Although not illustrated, in an exemplary embodiment of manufacturing a display device a laser beam is radiated to a portion of the lower substrate 401 that does not overlap (i.e., is exposed by) the upper substrate 402, thereby diminishing adhesion between the first flexible layer 451 and the lower substrate 401 at such portion. Subsequently, the portion of the lower substrate 401 to which the laser beam is radiated is separated from a remainder of the lower substrate 401 such as by being removed by a laser or a cutter. A terminal end of the first flexible layer 451 may coincide (e.g., be aligned with) a terminal end of the lower substrate 401 at which the portion thereof is separated as described above.

With the portion of the lower substrate 401 separated from the remainder of the lower substrate 401, the lower and upper panels 101 and 102 may have substantially a same planar size as each other, such that a planar area of one panel is not exposed by the other panel. Referring to FIG. 5, where the lower and upper panels 101 and 102 have substantially a same planar size as each other, the pad portion 104 connected to the lower panel 101 is bent along a terminal side surface of the lower substrate 401, such that a width of a bezel in the top plan view of the display device may be reduced.

The first flexible layer 451 may have a cross-sectional thickness in a range of about 10 nanometers (nm) to about 100 nm.

To electrically connect the wiring unit 452 and the driving circuit board 105 to each other, at least a portion of the first flexible layer 451 may be removed using an alkali-based solution or a laser. The portion of the first flexible layer 451 removed using an alkali-based solution or a laser may be a portion of the first flexible layer 451 initially extended further than a terminal edge of the lower substrate 401. While FIG. 5 illustrates a structure in which the entirety of the portion of the first flexible layer 451 that is positioned outwardly of the lower substrate 401 is removed, the present exemplary embodiment is not limited thereto.

The wiring unit 452 includes a signal wiring (not illustrated), and is disposed on the first flexible layer 451 to be elongated further than a terminal edge of the lower substrate 401.

The wiring unit 452 includes or is formed of the same material as that forming the gate electrode GE and the gate line GL, and is positioned in the same layer as a layer in which the gate electrode GE and the gate line GL are disposed among layers on the lower substrate 401. In other words, in an exemplary embodiment of manufacturing a display panel, the wiring unit 452 in the non-display area 112 may be simultaneously formed with the gate electrode GE and the gate line GL of the display area 111 in the same process.

The second flexible layer 453 is disposed on the wiring unit 452 in the non-display area 112, and as illustrated in FIG. 5, is elongated further than a terminal edge of the lower substrate 401. The second flexible layer 453 may include or be formed of a flexible, bendable material. In an exemplary embodiment, for example, the second flexible layer 453 may include or be formed of one of polyimide, polyethylene terephthalate, polycarbonate, polyethylene naphthalate and polyacrylate. The first flexible layer 451 and the second flexible layer 453 may include or be formed of the same material.

A cross-sectional thickness of the second flexible layer 453 is greater than that of the first flexible layer 451.

Figure 6:
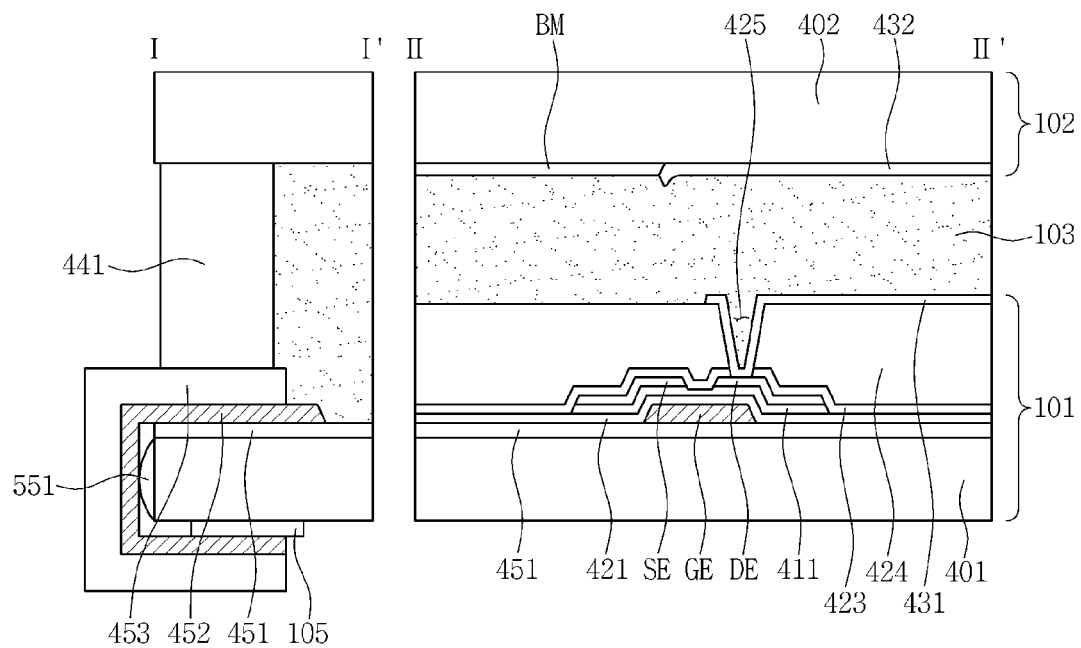
FIG. 6 is a cross-sectional view of another exemplary embodiment of a display device taken along line I-I' of FIG. 1 and taken along line II-II' of FIG. 4 according to the invention.

As illustrated in FIG. 6, another exemplary embodiment of a display device according to the invention may further include a passivation member 551 between a side surface of the terminal edge of the lower substrate 401 and the pad portion 104. The passivation member 551 may reduce or effectively prevent damage to the wiring unit 452, thereby preventing an electrical short-circuit of a signal applied to the lower panel 101.

Figure 7:
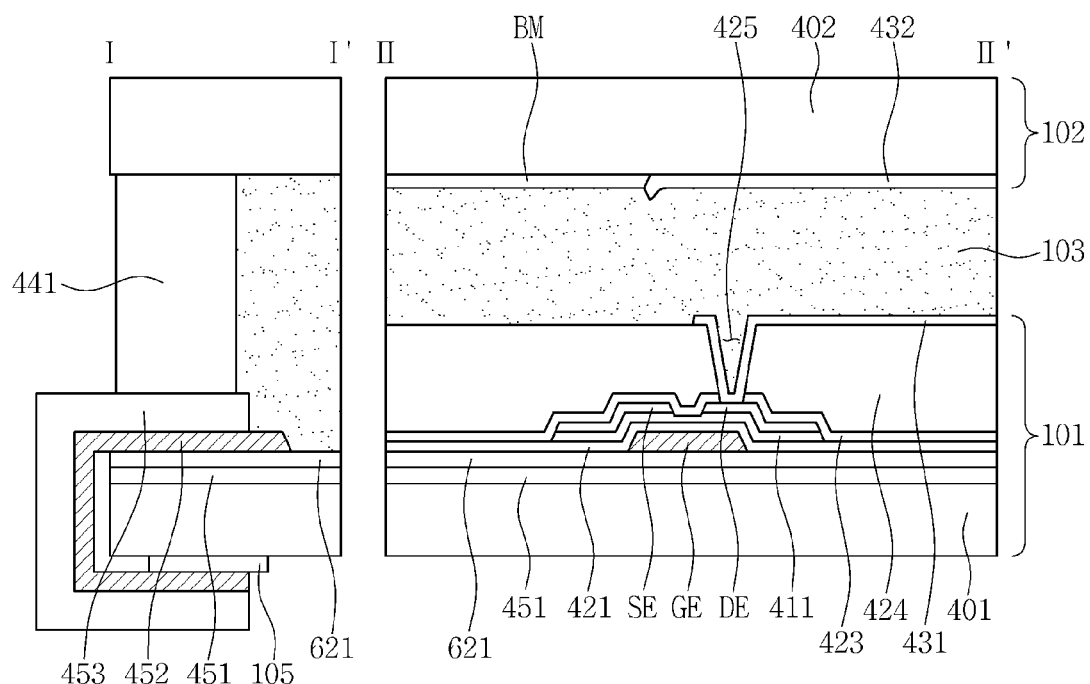
FIG. 7 is a cross-sectional view of still another exemplary embodiment of a display device taken along line I-I' of FIG. 1 and taken along line II-II' of FIG. 4 according to the invention.

As illustrated in FIG. 7, still another exemplary embodiment of a display device according to the invention may further include a buffer layer 621 on the first flexible layer 451. The buffer layer 621 may serve to enhance an interlayer adhesion property between the first flexible layer 451, and the same-layer gate electrode GE, the gate line GL and the wiring unit 452. The buffer layer 621 in the display area 111 may extended to be disposed in the non-display area 111. In an exemplary embodiment, for example, the buffer layer 621 may include or may be formed of $SiN_x$, $SiO_x$, or the like. The buffer layer 621 may have a multilayer structure including at least two insulating layers having different physical properties.

Figure 8:
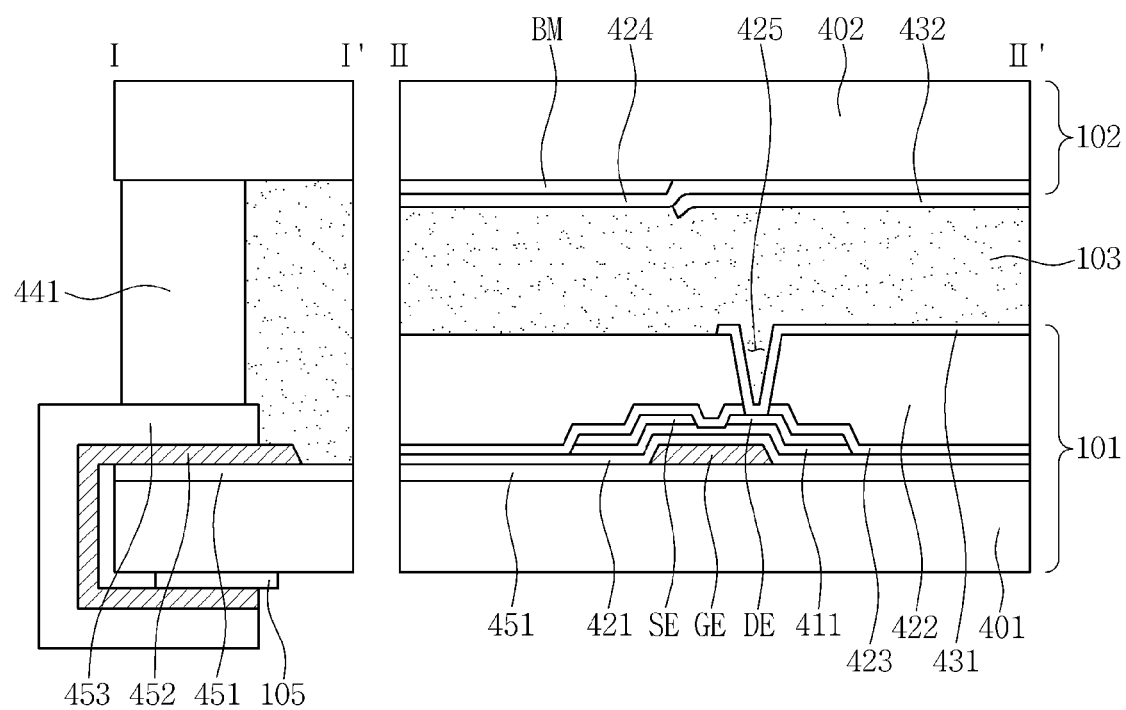
FIG. 8 is a cross-sectional view of yet another exemplary embodiment of a display device taken along line I-I' of FIG. 1 and taken along line II-II' of FIG. 4 according to the invention.

As illustrated in FIG. 8, yet another exemplary embodiment of a display device according to the invention, a color filter 424 may be disposed in the upper panel 102 including the common electrode 432 instead of the lower panel 101. In this instance, an insulating interlayer 422 may be disposed over an entire surface of the lower substrate 401 including the passivation layer 423 thereon, and the pixel electrode 431 may be disposed on the insulating interlayer 422. An aperture in the insulating interlayer 422 is formed corresponding to the drain contact hole 425. The insulating interlayer 422 may include or be formed of an organic material. The pixel electrode 431 is physically and/or electrically connected to the drain electrode DE at the drain contact hole 425. The drain contact hole 425 may be aligned with the aperture in the insulating interlayer 422.

As set forth above, according to one or more exemplary embodiments, the display device and the method of manufacturing the display device may provide a reduced bezel width by the wiring and the driving circuit disposed in a peripheral (e.g., non-display) area of a display panel being extended further than terminal edges of the display panel and bent along a terminal side surface of the lower panel. Accordingly, the degree of immersion of a user on a screen may be increased.

In addition, a step difference of the wiring may be resolved by reducing the thickness of the first flexible layer disposed below the wiring unit, such that a short-circuit of the wiring may be reduced or effectively prevented.

From the foregoing, it will be appreciated that various embodiments in accordance with the present disclosure have been described herein for purposes of illustration, and that various modifications may be made without departing from the scope and spirit of the present teachings. Accordingly, the various exemplary embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
a first panel and a second panel facing each other, each of which includes a display area in which an image is displayed and a non-display area in which an image is not displayed; and
a driving unit as a separate member from the first and second panels, connected to the first panel;
the first panel comprising:
a first flexible layer on a first substrate and in the display area and in the non-display area;
a thin film transistor on a portion of the first flexible layer in the display area, the thin film transistor comprising a gate electrode, a semiconductor layer, a source electrode and a drain electrode;
a wiring unit on a portion of the first flexible layer in the non-display area, the wiring unit comprising a signal wiring through which a signal is provided to the display area; and
a second flexible layer on the wiring unit in the non-display area, the second flexible layer in the non-display area elongated to define a portion thereof extended further than a terminal edge of the first substrate,
wherein the wiring unit with the second flexible layer thereon connects the driving circuit unit to the first panel.

2. The display device of claim 1, wherein the wiring unit in the non-display area is elongated to define a portion thereof extended further than the terminal edge of the first substrate from which the second flexible layer is elongated.

3. The display device of claim 2, wherein the extended portions of each of the wiring unit and the second flexible layer are bent along a side portion of the terminal edge of the first substrate.

4. The display device of claim 3, wherein the first flexible layer has a thickness less than that of the second flexible layer.

5. The display device of claim 1, wherein among layers of the first panel on the first substrate, the wiring unit is in a same layer as that of the gate electrode of the thin film transistor.

6. The display device of claim 1, wherein the wiring unit is connected to the thin film transistor.

7. The display device of claim 1, wherein the first flexible layer and the second flexible layer comprise one of polyimide, polyethylene terephthalate, polycarbonate, polyethylene naphthalate and polyacrylate.

8. The display device of claim 7, wherein the first flexible layer has thermal resistance at a temperature of about 300 Celsius or higher.

9. The display device of claim 3, further comprising a passivation member between the side portion of the terminal edge of the first substrate and the extended portion of the wiring unit bent along the side portion of the terminal edge of the first substrate.

10. The display device of claim 3, wherein the first flexible layer in the display area is elongated to define a portion thereof extended further than the terminal edge of the first substrate from which each of the second flexible layer and the wiring is elongated.

11. The display device of claim 10, wherein the second flexible layer extends further from the terminal edge of the first substrate than the first flexible layer.

12. The display device of claim 1, wherein the first panel further comprises a buffer layer between the first flexible layer and the thin film transistor in the display area and between the first flexible layer and the wiring unit in the non-display area.

13. The display device of claim 1, wherein the driving circuit unit comprises a flexible printed circuit board.

14. The display device of claim 1, wherein the first panel further comprises an insulating interlayer on the thin film transistor in the display area.

15. The display device of claim 14, wherein the first panel further comprises a pixel electrode on the insulating interlayer in the display area, the pixel electrode connected to the thin film transistor.

16. The display device of claim 1, wherein the second panel comprises a common electrode on a second substrate.

17. The display device of claim 1, further comprising a sealing portion between the first panel and the second panel.

18. The display device of claim 1, wherein the first panel further comprises a color filter on the thin film transistor in the display area.

* * * * *